(12) United States Patent
Okamura et al.

(10) Patent No.: US 6,251,216 B1
(45) Date of Patent: Jun. 26, 2001

(54) APPARATUS AND METHOD FOR PLASMA PROCESSING

(75) Inventors: Hideaki Okamura; Shinichi Imai; Nobuhiro Jiwari; Yoko Tohmori, all of Osaka (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/212,411

(22) Filed: Dec. 16, 1998

(30) Foreign Application Priority Data

Dec. 17, 1997 (JP) .................................................... 9-348120

(51) Int. Cl.⁷ .................................................... H05H 1/00
(52) U.S. Cl. ...................... 156/345; 118/723 E; 118/728; 216/67; 216/71; 438/710; 438/729; 438/723

(58) Field of Search .......................... 156/345; 118/723 E, 118/723 R, 728; 216/67, 71; 438/710, 729, 723

(56) References Cited

U.S. PATENT DOCUMENTS 5,435,880 * 7/1995 Minato et al. ........................ 156/345

* cited by examiner

*Primary Examiner*—Thi Dang
(74) *Attorney, Agent, or Firm*—Eric J. Robinson; Nixon Peabody LLP

(57) ABSTRACT

A plasma processing apparatus includes a reaction chamber in which plasma is generated from a reactive gas introduced thereto and a film on a substrate is processed with the plasma generated. The main members of the reaction chamber are covered with protective members made of synthetic quartz.

6 Claims, 6 Drawing Sheets

APPARATUS AND METHOD FOR PLASMA PROCESSING

BACKGROUND OF THE INVENTION

The present invention generally relates to apparatus and method for plasma processing. Specifically, the present invention relates to a plasma processing apparatus including a reaction chamber where plasma is generated from a reactive gas introduced thereto and a film on a substrate is processed with the plasma generated, and to a plasma processing method for performing plasma etching in the reaction chamber.

Plasma processing methods are applied to various kinds of processing steps like etching a film on a substrate with plasma to form a fine-line pattern, and play a significant role in the fabrication process of a semiconductor device.

The main members (e.g., the walls) of a reaction chamber for performing various types of plasma processing such as plasma etching are ordinarily made of aluminum. However, aluminum acts as an acceptor (i.e., p-type impurity) against silicon, which is a typical material of a semiconductor substrate. Accordingly, it is necessary to prevent aluminum, coming from an etched part of a main member of the reaction chamber such as a wall thereof, from diffusing on the semiconductor substrate. Thus, the main members of the reaction chamber are usually covered with protective members lest the main members should be etched by plasma.

A protective member is ordinarily made of alumina (aluminum oxide) obtained by subjecting the surface of aluminum to an anodic oxide coating treatment (i.e., a so-called "ALUMITE" treatment), because this treatment is easy. In general, alumina is hard to be etched. Accordingly, if a protective member, made of aluminum including alumina regions on the surface thereof, is used, then impurities generated from the protective member can be reduced.

Recently, such protective members, covering the main members of a reaction chamber, not only plays the originally intended role of protecting the main members from plasma, but also is positively used for controlling the etching characteristics. Its objective is to properly deal with the ever-lasting miniaturization of semiconductor integrated circuits. Also, since the density of plasma has been drastically increased nowadays, the state of plasma affects the etching characteristics to a far larger degree than what it used to be. In view of these situations, the state of plasma is desirably kept as uniform and constant as possible. For example, suppose a silicon dioxide film on a semiconductor substrate is etched with plasma. In such a case, if the main members of a reaction chamber are covered with protective members made of quartz, which has the same composition as the silicon dioxide film, then a region where plasma has been generated is surrounded by silicon dioxide (or quartz). Accordingly, the plasma generated in the region equally etches the silicon dioxide film on the semiconductor substrate and the protective members of the reaction chamber under the same conditions. As a result, the state of the plasma is invariable with the passage of time and spatially uniform.

Nevertheless, if the main members of a reaction chamber are covered with such protective members made of quartz, then the quartz protective members are also etched unintentionally as the etching on the silicon dioxide film proceeds. However, the substance resulting from the etched quartz of the protective member acts as neither acceptor nor donor against silicon unlike aluminum. Accordingly, even if such a substance diffuses onto the semiconductor substrate, the electrical characteristics of a semiconductor device are not adversely affected by the substance.

Because of these reasons, quartz is superior to aluminum as a material for the protective members of the main members of a reaction chamber used for performing plasma etching on a semiconductor integrated circuit component, which should be formed in an even smaller size.

Also, according to a proposed technique, alumina and quartz are used in combination. Specifically, alumina is used for protective members covering the main members of a reaction chamber, because alumina has the above-described advantages. And a ring member made of quartz is disposed around a substrate placed on a sample stage, because the etching characteristics are particularly affected by the state of plasma on the periphery of a film to be processed. The objective thereof will be described below. If a silicon dioxide film, or the film to be processed, and the member disposed around the substrate on the sample stage are made of different materials, then the objects in contact with the plasma are greatly different from each other in the vicinity of the interface between the periphery of the silicon dioxide film and the sample stage. Accordingly, the state of the plasma on the periphery of the silicon dioxide film is different from the state of the plasma at the center of the silicon dioxide film. As a result, the characteristics of etching on the silicon dioxide film are variable within the plane of the silicon dioxide film. Therefore, in order to keep the state of plasma constant, the quartz ring member is disposed around the substrate placed on the sample stage.

If the main members of a reaction chamber are covered with quartz protective members or if a quartz ring member is disposed around a substrate placed on a sample stage, then the state of plasma can be surely kept constant and uniform. However, even in such a case, it is still impossible to prevent impurities, deposited on a film to be processed, from adversely affecting the electrical characteristics of a semiconductor device. This problem will be briefly discussed below.

For example, if impurities are deposited on a film to be processed, then a pause time (i.e., a charge retention time per memory cell), one of the parameters for evaluating the reliability of a DRAM, disadvantageously decreases. It is considered that the pause time probably decreases because of the generation of leakage current resulting from the deposition of impurities such as sodium onto a memory cell of the DRAM.

Thus, it has been believed an urgent task to prevent impurities, contained in reactants flaked off the main or protective members of a reaction chamber, from being deposited on a film to be processed by regularly cleaning the main and protective members and removing the deposited reactants therefrom.

In order to confirm the effects of such regular cleaning, the present inventors carried out experimental plasma etching with a reduced amount of reactants deposited on the main and protective members of the reaction chamber by cleaning these members regularly and carefully. However, we faced a problem that the pause time of a DRAM still could not be increased.

SUMMARY OF THE INVENTION

In view of these problems, the objects of this invention is to keep plasma as uniform as possible by covering the main members of a reaction chamber with quartz protective members and/or disposing a quartz ring member around a substrate placed on a sample stage and to reduce impurities deposited on a film placed on the substrate.

In order to accomplish these objects, the present inventors analyzed from various angles the reasons why the impurities, deposited on the film to be processed, are generated. As a result, we arrived at the following conclusions.

The first conclusion is: the pause time of a DRAM obtained by plasma etching with the main members of a reaction chamber covered with quartz protective members is inferior to that of a DRAM obtained by plasma etching with the main members covered with alumina protective members.

Based on this result, we performed experiments on the pause time of a DRAM obtained by plasma etching with the main members of a reaction chamber covered with alumina protective members. Consequently, we reached the second conclusion that the pause time of a DRAM obtained with a quartz ring member disposed around a substrate placed on a sample stage is inferior to that of a DRAM obtained with the ring member not disposed there.

Thus, we suspected that the quartz protective member or ring member might be the source of generating impurities, and analyzed the material quality of quartz as the component of the protective and ring members and the amounts of impurities contained in quartz. As a result, we found the following facts. First, quartz used for the protective or ring members is fused quartz. Second, the amounts of the impurities contained in fused quartz are large enough to affect the recent dramatic increase in density of plasma and drastic downsizing of a semiconductor integrated circuit. And, the amounts of impurities contained in synthetic quartz are considerably smaller than those of impurities contained in fused quartz.

The present invention was conceived based on these findings, and is characterized by using synthetic quartz, instead of fused quartz conventionally used, as a material for protective members covering the main members of a reaction chamber or a ring member disposed around a substrate.

Specifically, a first plasma processing apparatus according to the present invention includes a reaction chamber in which plasma is generated from a reactive gas introduced thereto and a film on a substrate is processed with the plasma generated. The main members of the reaction chamber are covered with protective members made of synthetic quartz.

In the first plasma processing apparatus, the main members of a reaction chamber are covered with protective members made of synthetic quartz. Thus, when a silicon dioxide film is etched with plasma in such a reaction chamber, the silicon dioxide film and the protective members are both etched by the plasma on the same conditions. Accordingly, the plasma is kept in a uniform state both temporally and spatially. In this case, the plasma generated in the reaction chamber etches the protective members. But since the protective members made of synthetic quartz contain very small amounts of impurities, the amounts of impurities released from the protective members or deposited on the surface of a film to be processed are extremely small. As a result, the pause time of a DRAM formed on the substrate can be increased.

A second plasma processing apparatus according to the present invention includes a reaction chamber in which plasma is generated from a reactive gas introduced thereto and a film on a substrate placed on a sample stage is processed with the plasma generated. A ring member made of synthetic quartz is disposed around a region of the sample stage where the substrate is placed.

In the second plasma processing apparatus, a ring member made of synthetic quartz is disposed around a region of the sample stage where the substrate is placed. Thus, when a silicon dioxide film on the substrate is etched with plasma, the silicon dioxide film, which is the film to be processed, is made of the same material as that of the surrounding member around the film. Accordingly, since the plasma on the periphery of the film to be processed is in the same state as the plasma at the center of the film, the characteristics of etching on the film to be processed is uniform over the entire plane of the film. In this case, the plasma generated in the reaction chamber etches the ring member. But since the ring member made of synthetic quartz contains very small amounts of impurities, the amounts of impurities released from the ring member or deposited on the surface of a film to be processed are extremely small. As a result, the pause time of a DRAM formed on the substrate can be increased.

In the first or second plasma processing apparatus, an impurity is contained in the synthetic quartz at preferably less than 0.1 ppm.

In such an embodiment, even though plasma etches the protective members or the ring member, substantially no impurities are released from the protective members or the ring member. Accordingly, the pause time of a DRAM formed on the substrate can be even more increased.

In this case, an impurity contained in the synthetic quartz may be selected from the group consisting of sodium, calcium, potassium, aluminum, iron and magnesium. If the impurity is any of these materials, the adverse effects of the impurities on the pause time of a DRAM can be eliminated with a lot more certainty.

A plasma processing method according to the present invention includes the steps of: placing a substrate, on the surface of which a silicon dioxide film has been formed, on a substrate placing region of a sample stage provided in a reaction chamber, and disposing a ring member made of synthetic quartz around the substrate placing region of the sample stage; introducing a reactive gas into the reaction chamber and generating plasma from the reactive gas introduced; and etching the silicon dioxide film with the plasma.

In accordance with the plasma processing method of the present invention, a ring member made of synthetic quartz is disposed around a region of the sample stage where the substrate is placed. Thus, a silicon dioxide film, which is the film to be processed, is made of the same material as that of the surrounding member around the film. Accordingly, since the plasma on the periphery of the film to be processed is in the same state as the plasma at the center of the film, the characteristics of etching on the film to be processed is uniform over the entire plane of the film. Also, since the ring member made of synthetic quartz contains very small amounts of impurities, the amounts of impurities released from the ring member or deposited on the surface of a film to be processed are extremely small even though the plasma etches the ring member. As a result, the pause time of a DRAM formed on the substrate can be increased.

DESCRIPTION OF THE PREFERRED EMBODIMENTS

EMBODIMENT 1

Hereinafter, a plasma processing apparatus according to the first embodiment of the present invention will be described with reference to FIGS. 1 through 4.

Figure 1:
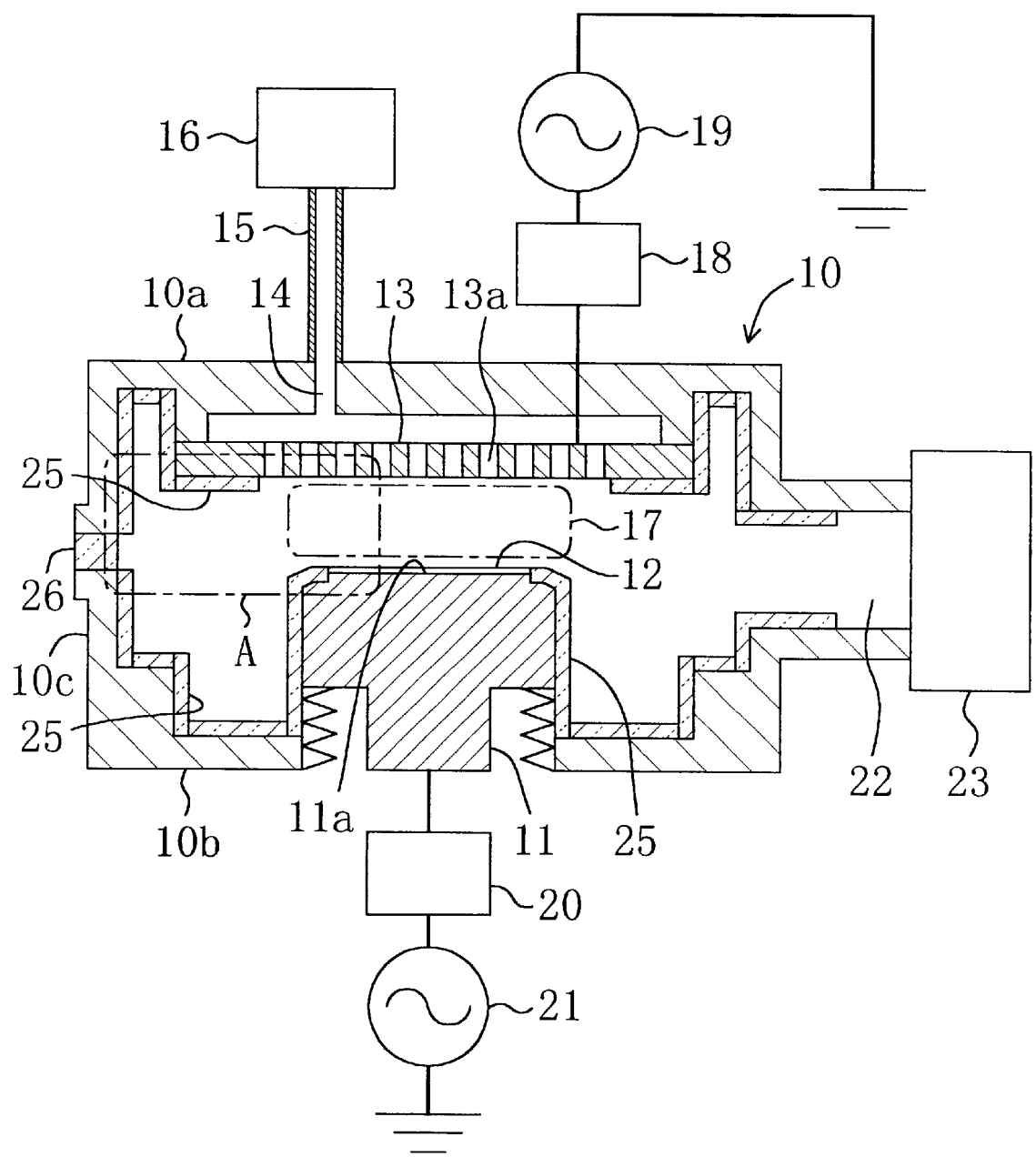
FIG. 1 is a cross-sectional view of a plasma processing apparatus according to the first embodiment of the present invention.

FIG. 1 illustrates the cross-sectional structure of the plasma processing apparatus of the first embodiment. As shown in FIG. 1, a sample stage 11 is provided as a lower electrode inside a reaction chamber 10, and has a substrate holding portion 11a for holding a semiconductor substrate 12 thereon. An upper electrode 13 is provided inside the reaction chamber 10 so as to face the substrate holding portion 11a of the sample stage 11. A large number of gas dispersing holes 13a are formed in the upper electrode 13.

A gas inlet port 14 is formed through the upper bottom 10a of the reaction chamber 10, and communicates with a gas supply pump 16 via a gas supply path 15. In this configuration, a reactive gas, supplied from the gas supply pump 16, is introduced into the reaction chamber 10 through the gas supply path 15, dispersed through the gas dispersing holes 13a of the upper electrode 13 and then led to a plasma generating region 17.

The upper electrode 13 is connected to a first RF power supply 19 via a first impedance matcher 18. The reactive gas introduced into the plasma generating region 17 is turned into plasma by the RF power applied by the first RF power supply 19 to the upper electrode 13.

The sample stage 11 is connected to a second RF power supply 21 via a second impedance matcher 20. The plasma, generated in the plasma generating region 17, is made to impinge onto the semiconductor substrate 12 held on the substrate holding portion 11a of the sample stage 11 by the application of the RF power from the second RF power supply 21 to the sample stage 11.

A gas outlet port 22 is provided in a sidewall of the reaction chamber 10 and communicates with a gas exhaust pump 23.

Thus, when an etching gas is supplied as a reactive gas from the gas supply pump 16, plasma is generated from the etching gas in the plasma generating region 17 and impinges onto the semiconductor substrate 12. As a result, a film to be processed, which has been formed on the semiconductor substrate 12, is etched with the plasma. Also, redundant plasma and reactants generated as a result of plasma etching are exhausted through the gas outlet port 22 to the outside.

The first embodiment is characterized in that the main members of the reaction chamber 10, namely, upper bottom 10a, lower bottom 10b, sidewall 10c, sample stage 11 (except for the substrate holding portion 11a) and periphery of the upper electrode 13, are covered with synthetic quartz protective members 25. And a view port 26 for observing the inside of the reaction chamber 10 is also made of synthetic quartz.

In the first embodiment, the main members of the reaction chamber 10 are covered with the protective members 25 made of synthetic quartz, and the view port 26 is also made of synthetic quartz. Thus, even when the protective members 25 and the view port 26 are exposed to and etched by the plasma generated in the plasma generating region 17, substantially no impurities, such as sodium, calcium, potassium, aluminum, iron or magnesium, are released from the protective members 25 or the view port 26.

Since substantially no impurities are released from the protective members 25 or the view port 26, substantially no impurities are deposited onto a film to be processed that is formed on the surface of the semiconductor substrate 12. Accordingly, the pause time of a DRAM formed on the principal surface of the semiconductor substrate 12 can be increased to a large degree.

Figure 2:
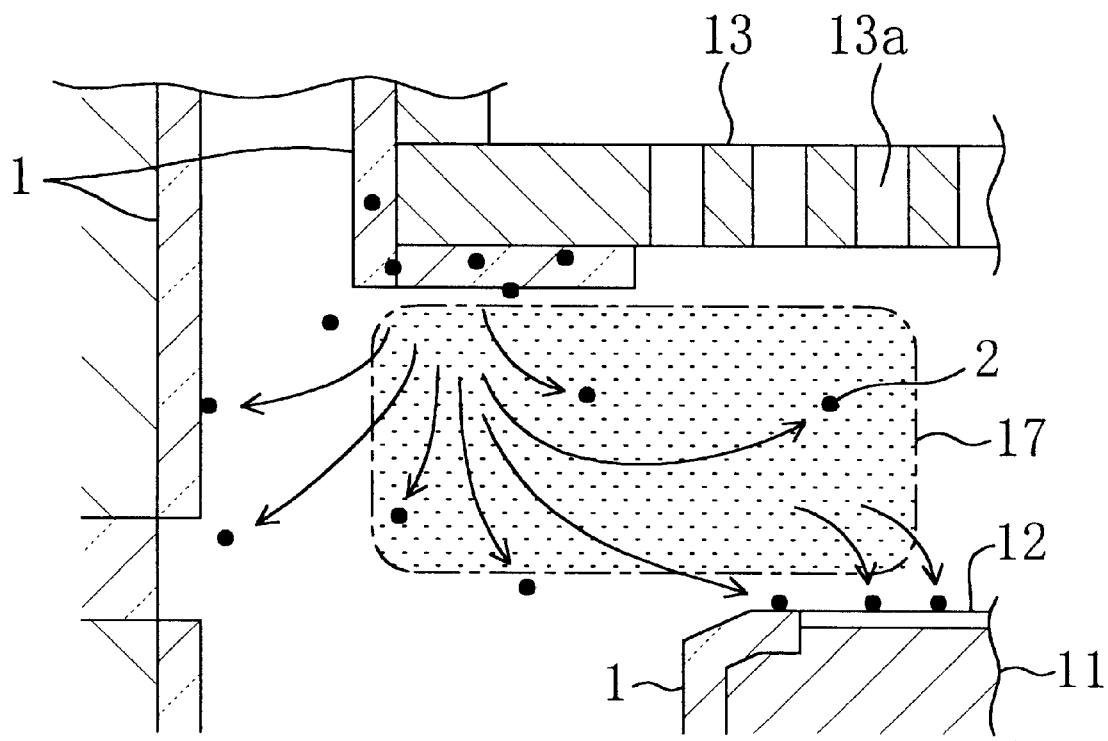
FIG. 2 is a cross-sectional view illustrating the principal portion, corresponding to the portion A encircled by the one dot chain in FIG. 1, of a conventional plasma processing apparatus.

FIG. 2 illustrates the cross-sectional structure of the principal portion of a conventional plasma processing apparatus, which corresponds to the portion A encircled by the one dot chain in FIG. 1. In FIG. 2, the same members as those of the plasma processing apparatus of the first embodiment shown in FIG. 1 are identified by the same reference numerals and the description thereof will be omitted herein. As shown in FIG. 2, the main members of the reaction chamber of the conventional plasma processing apparatus are covered with protective members 1 made of fused quartz.

In the conventional plasma processing apparatus, when the fused-quartz protective members 1 are exposed to plasma generated in the plasma generating region 17, a lot of impurities are released from some of the protective members 1 and deposited onto the surface of the semiconductor substrate 12 or re-deposited onto other protective members 1. As a result, the pause time of a DRAM formed on the principal surface of the semiconductor substrate 12 adversely decreases.

Figure 3:
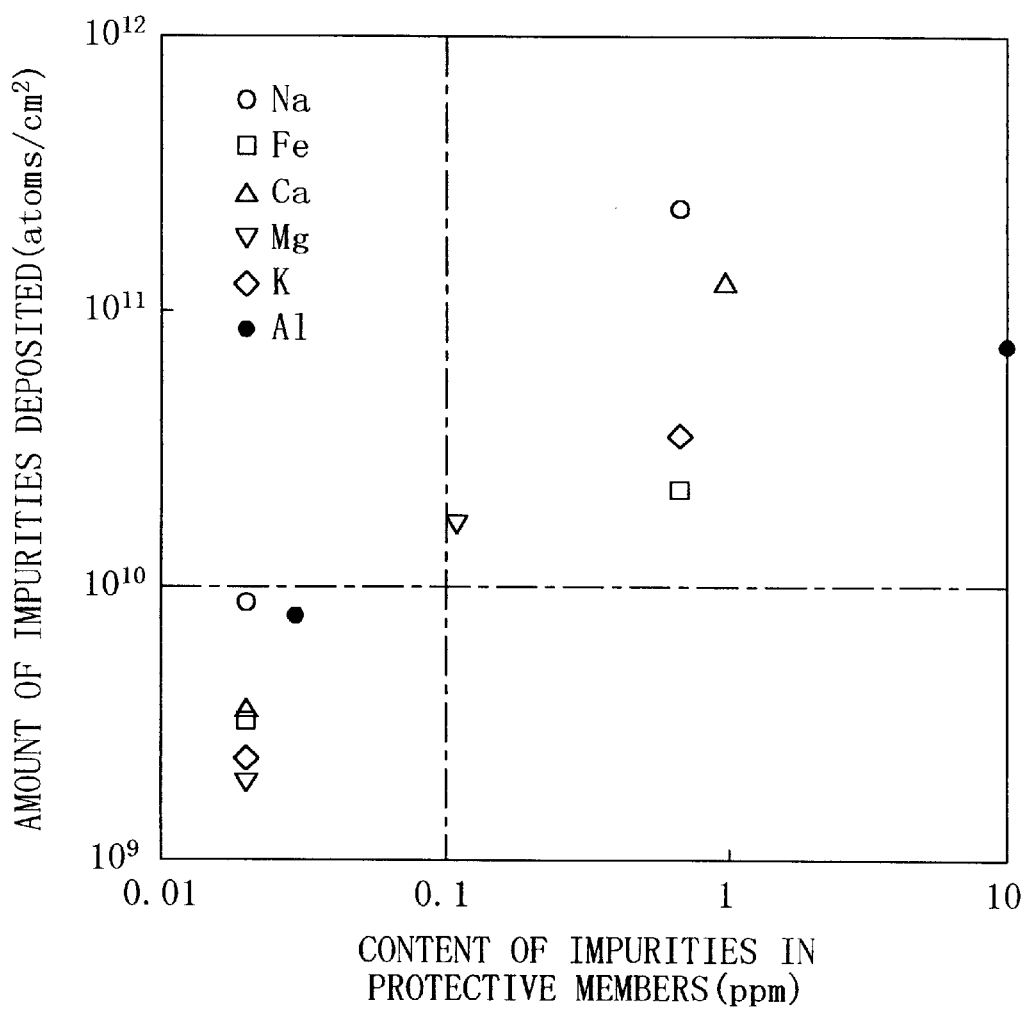
FIG. 3 is a graph illustrating the relationship between the content of impurities in protective members and the amount of impurities deposited on the surface of a substrate.

FIG. 3 illustrates the relationship between the content of impurities in the protective members and the amount of impurities deposited onto the surface of the semiconductor substrate. As shown in FIG. 3, it can be seen that the larger the amount of impurities contained in the protective members is, the larger the amount of impurities deposited onto the substrate is. In other words, the smaller the amount of impurities contained in the protective members is, the smaller the amount of impurities deposited onto the substrate is.

In FIG. 3, a relationship between the content of impurities in the protective members 1, made of fused quartz conventionally used (abscissas), and the amount of deposited impurities with the protective members 1 made of fused quartz used (ordinates) is shown in the upper right domain. A relationship between the content of impurities in the protective members 25, made of synthetic quartz in the first embodiment (abscissas), and the amount of deposited impurities with the synthetic quartz protective members 25 used (ordinates) is shown in the lower left domain of FIG. 3. As is clear from FIG. 3, the amount of impurities deposited onto the surface of the semiconductor substrate can be reduced to less than $1 \times 10^{10}$ in accordance with the first embodiment.

Figure 4:
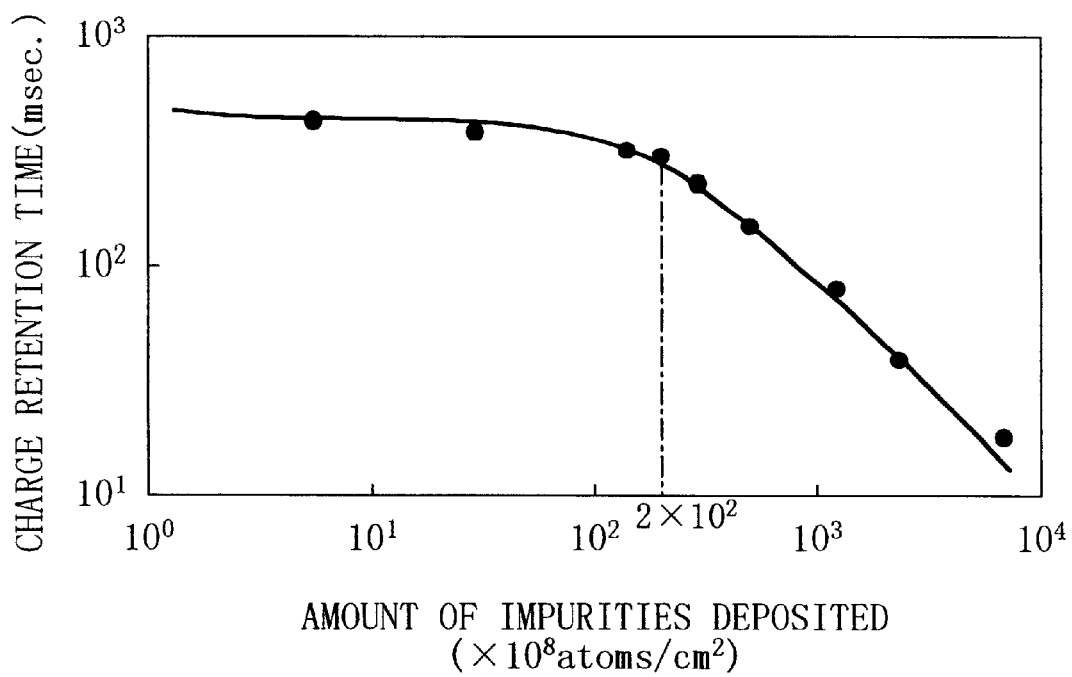
FIG. 4 is a graph illustrating the relationship between the amount of impurities deposited on the surface of a substrate and a pause time (i.e., charge retention time).

FIG. 4 illustrates the relationship between the amount of impurities deposited onto the surface of the semiconductor substrate (abscissas) and the pause time (charge retention time; ordinates). As can be understood from FIG. 4, the larger the amount of impurities deposited is, the shorter the pause time is. And if the amount of impurities deposited is $2 \times 10^{10}$ or more, the pause time abruptly decreases.

According to the first embodiment, the amount of impurities deposited onto the surface of the semiconductor substrate can be reduced to less than $1 \times 10^{10}$ as described with reference to FIG. 3. Thus, as can be seen from FIG. 4, the pause time can be greatly reduced.

Hereinafter, calculated and actually measured values of the amount of impurities deposited onto the surface of a semiconductor substrate will be described for the cases of using fused-quartz protective members as in the prior art and using synthetic-quartz protective members as in the first embodiment.

The calculated value of the amount A of impurities deposited on the surface of a semiconductor substrate is obtained by:

$$A = DVCN/(MS)$$

where D is the density of the protective members, V is the volume of the protective members, C is the content of impurities in the protective members, N is Avogadro's number, M is the molecular weight of the impurities and S is the area of the semiconductor substrate.

On the other hand, the actually measured value of the amount of impurities deposited on the surface of the semiconductor substrate was obtained as follows. Specifically, a silicon dioxide film formed over the entire surface of a silicon substrate was dry-etched on the following conditions:

Etching gas: $C_4F_8/CO/Ar/O_2 = 5-20/5-20/100-400/5-20$ sccm

RF power applied to upper electrode: 1,000 to 2,000 W

RF power applied to lower electrode: 500 to 1,500 W

Etching time: 30 to 120 seconds

Then, the surface of the silicon substrate was dissolved with HF vapor and the solution was recovered into 0.7 wt % $HNO_3$ solution. Next, the recovered solution was analyzed by flameless atomic absorption spectroscopy.

TABLE 1

|  | Na | Ca | K | Al | Fe | Mg |
| --- | --- | --- | --- | --- | --- | --- |
| Impurity Content (ppm) | 0.8–0.4 | 0.4–1.0 | 0.2–0.8 | 9.0–50 | 0.3–0.7 | 0.1 |
| Typical Impurity Content (ppm) | 1.0 | 1.0 | 0.7 | 10.0 | 0.7 | 0.1 |
| Impurity Deposited (calculated; $\times 10^{10}$ cm$^2$) | 51.7 | 29.7 | 21.3 | 440 | 14.9 | 4.89 |

TABLE 1-continued

|  | Na | Ca | K | Al | Fe | Mg |
| --- | --- | --- | --- | --- | --- | --- |
| Impurity Deposited (measured; $\times 10^{10}$ cm$^2$) | 24.0 | 13.0 | 3.6 | 7.8 | 2.3 | 1.7 |

Table 1 illustrates a case of using fused quartz. Fused quartz contains the impurities of: sodium (content: 0.8 to 4.0 ppm); calcium (content: 0.4 to 1.0 ppm); potassium (content: 0.2 to 0.8 ppm); aluminum (content: 9.0 to 50 ppm); iron (content: 0.3 to 0.7 ppm); and magnesium (content: 0.1 ppm). These data are extracted from the catalogs of Tokyo Fine Glass Corp. and Asahi Glass Co., Ltd., and Chemistry Handbook (Developed Course) edited by Japan Chemical Industry Association. Accordingly, the typical values of the impurities contained in fused quartz are herein defined at 1.0 ppm, 1.0 ppm, 0.7 ppm, 10.0 ppm, 0.7 ppm and 0.1 ppm for sodium, calcium, potassium, aluminum, iron and magnesium, respectively.

If the contents of impurities are defined at these typical values, then the amounts of impurities on the semiconductor substrate are calculated as $51.7 \times 10^{10}/cm^2$, $29.7 \times 10^{10}/cm^2$, $21.3 \times 10^{10}/cm^2$, $440 \times 10^{10}/cm^2$, $14.9 \times 10^{10}/cm^2$ and $4.89 \times 10^{10}/cm^2$ for sodium, calcium, potassium, aluminum, iron and magnesium, respectively. The actually measured values of the amounts of impurities are $24.0 \times 10^{10}/cm^2$, $13.0 \times 10^{10}/cm^2$, $3.6 \times 10^{10}/cm^2$, $7.8 \times 10^{10}/cm^2$, $2.3 \times 10^{10}/cm^2$ and $1.7 \times 10^{10}/cm^2$ for sodium, calcium, potassium, aluminum, iron and magnesium, respectively.

TABLE 2

|  | Na | Ca | K | Al | Fe | Mg |
| --- | --- | --- | --- | --- | --- | --- |
| Impurity Content (ppm) | <0.07 | <0.1 | <0.03 | <0.05 | <0.1 | <0.02 |
| Typical Impurity Content (ppm) | 0.02 | 0.02 | 0.02 | 0.03 | 0.02 | 0.02 |
| Impurity Deposited (calculated; $\times 10^{10}$ cm$^2$) | 1.003 | 0.593 | 0.608 | 1.32 | 0.426 | 0.979 |
| Impurity Deposited (measured; $\times 10^{10}$ cm$^2$) | 0.895 | 0.364 | 0.237 | 0.802 | 0.328 | 0.194 |

Table 2 illustrates a case of using synthetic quartz. Synthetic quartz contains the impurities of: sodium (content: to less than 0.07 ppm); calcium (content: less than 0.1 ppm); potassium (content: less than 0.03 ppm); aluminum (content: less than 0.05 ppm); iron (content: less than 0.1 ppm); and magnesium (content: less than 0.02 ppm). These data are also extracted from the catalogs of Tokyo Fine Glass Corp. and Asahi Glass Co., Ltd., and Chemistry Handbook (Developed Course) edited by Japan Chemical Industry Association. Accordingly, the typical values of the impurities contained in synthetic quartz are herein defined at 0.02 ppm, 0.02 ppm, 0.02 ppm, 0.03 ppm, 0.02 ppm and 0.02 ppm for sodium, calcium, potassium, aluminum, iron and magnesium, respectively.

If the contents of impurities are defined at these typical values, then the amounts of impurities on the semiconductor substrate are calculated as $1.003 \times 10^{10}/cm^2$, $0.593 \times 10^{10}/cm^2$, $0.608 \times 10^{10}/cm^2$, $1.32 \times 10^{10}/cm^2$, $0.426 \times 10^{10}/cm^2$ and $0.979 \times 10^{10}/cm^2$ for sodium, calcium, potassium, aluminum, iron and magnesium, respectively. The actually measured values of the amounts of impurities are $0.895 \times 10^{10}/cm^2$, $0.364 \times 10^{10}/cm^2$, $0.237 \times 10^{10}/cm^2$, $0.802 \times 10^{10}/cm^2$, $0.328 \times 10/cm^2$ and $0.194 \times 10^{10}/cm^2$ for sodium, calcium, potassium, aluminum, iron and magnesium, respectively.

EMBODIMENT 2

Hereinafter, a plasma processing apparatus according to the second embodiment of the present invention will be described with reference to FIGS. 5, 6(a) and 6(b).

Figure 5:
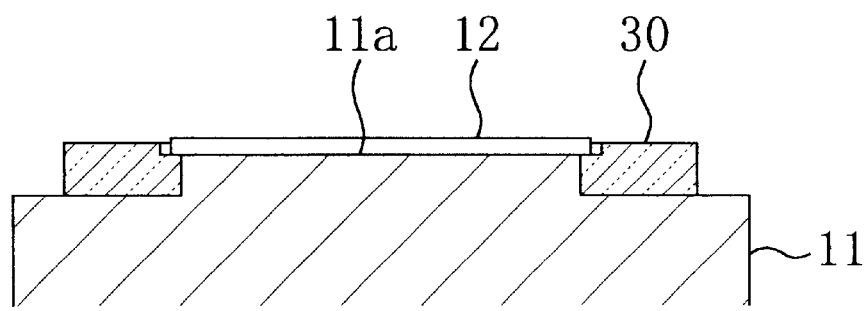
FIG. 5 is a cross-sectional view illustrating the principal portion of a plasma processing apparatus according to the second embodiment of the present invention.

The plasma processing apparatus of the second embodiment is characterized in that a ring member 30 made of synthetic quartz is disposed around the substrate placing portion 11a (i.e., the substrate holding portion) on which the semiconductor substrate 12 is placed as shown in FIG. 5. Since the other members are the same as those used in the first embodiment, the illustration and description thereof will be omitted herein. The protective members covering the main members of the reaction chamber and the view port may be made of synthetic quartz as in the first embodiment or fused quartz as in the prior art.

Figure 6A:
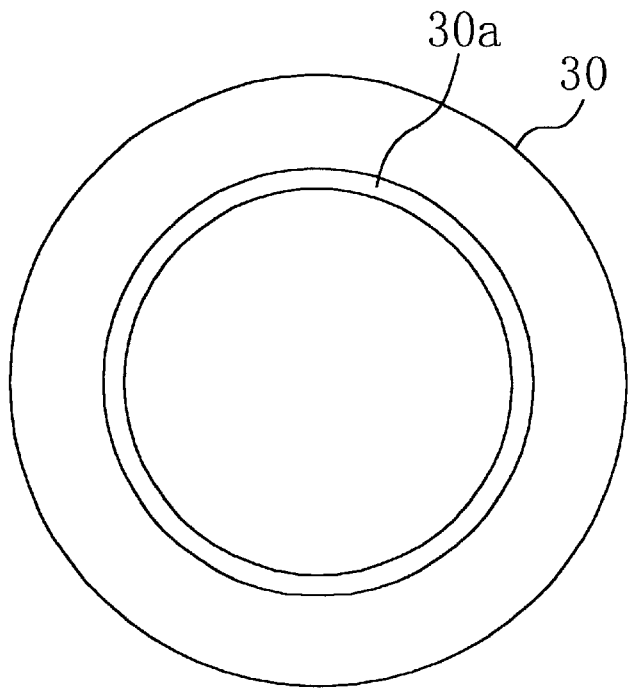
FIGS. 6(a) and 6(b) are respectively plan view and cross-sectional view illustrating in detail a ring member for the plasma processing apparatus of the second embodiment.
Figure 6B:
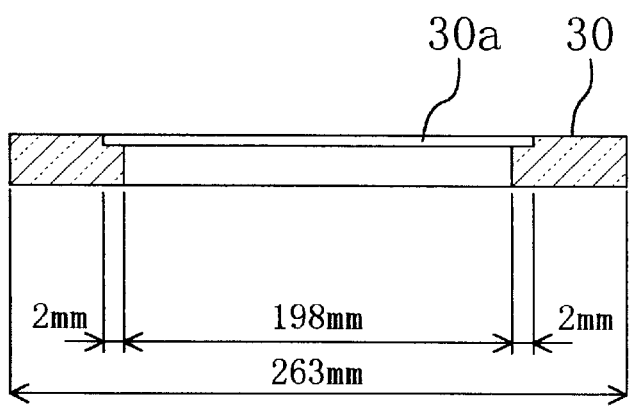

As shown in FIGS. 6(a) and 6(b), the ring member 30 made of synthetic quartz includes a stepped portion 30a having an inner diameter slightly larger than the diameter of the semiconductor substrate in the shape of a wafer. Thus, the periphery of the semiconductor substrate 12 placed in the substrate placing region 11a of the sample stage 11 is mounted on the stepped portion 30a of the ring member 30. Accordingly, the substrate holding portion 11a of the sample stage 11 is not exposed to the plasma generating region 17 (see FIG. 1).

As can be understood, the ring member 30 made of synthetic quartz is disposed around the substrate placing region 11a of the sample stage 11 in this second embodiment. Thus, even when the ring member 30 is exposed to and etched by the plasma generated in the plasma generating region 17, substantially no impurities such as sodium, calcium, potassium, aluminum, iron and magnesium are released from the ring member 30.

Hereinafter, a plasma etching method using the plasma processing apparatus of the second embodiment will be described with reference to FIGS. 7(a) through 7(d).

Figure 7A:
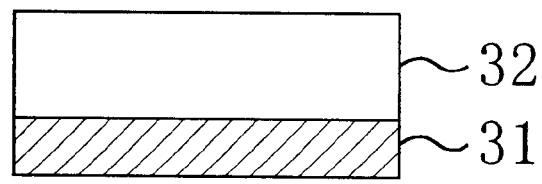
FIGS. 7(a) through 7(d) are cross-sectional views illustrating respective process steps of plasma etching performed using the plasma processing apparatus of the second embodiment.
Figure 7B:
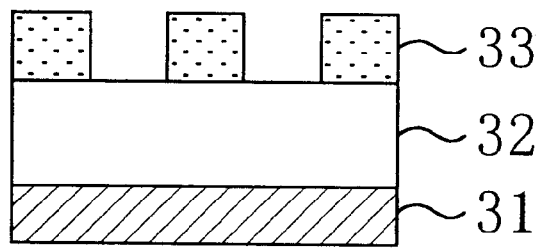

First, as shown in FIG. 7(a), a silicon dioxide film 32, made of BPSG, is deposited on a semiconductor substrate 31. Then, as shown in FIG. 7(b), a resist pattern 33 is formed on the silicon dioxide film 32.

Next, the semiconductor substrate 31, with the resist pattern 33 formed on the silicon dioxide film 32, is placed on the substrate placing region 11a of the sample stage 11 in the plasma processing apparatus of the second embodiment. And the ring member 30 made of synthetic quartz is disposed around the semiconductor substrate 31.

Figure 7C:
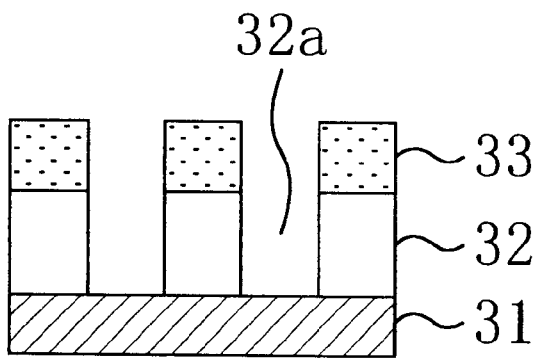
Figure 7D:
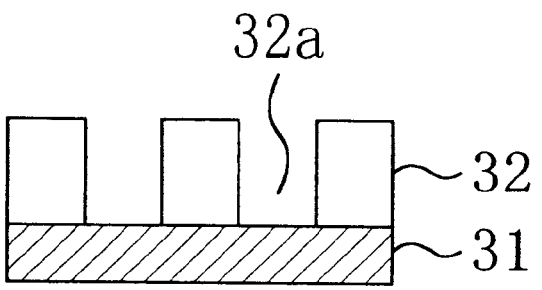

Subsequently, as shown in FIG. 7(c), the silicon dioxide film 32 is etched with plasma using the resist pattern 33 as a mask, thereby forming contact holes 32a in the silicon dioxide film 32. And as shown in FIG. 7(d), the resist pattern 33 is removed.

In accordance with the plasma etching method performed using the plasma processing apparatus of the second embodiment, impurities are much less likely to be released from the ring member 30 made of synthetic quartz during the process step of etching the silicon dioxide film 32. Thus, since substantially no impurities are deposited on the surface of the silicon dioxide film 32, the pause time of a DRAM formed on the principal surface of the semiconductor substrate 31 can be considerably increased.

What is claimed is:

1. A plasma processing apparatus comprising a reaction chamber in which plasma is generated from a reactive gas introduced thereto and a film on a substrate is processed with the plasma generated, wherein main members of the reaction chamber are covered with protective members made of synthetic quartz, wherein an impurity is contained in the synthetic quartz at less than 0.1 ppm.

2. A plasma processing apparatus comprising a reaction chamber in which plasma is generated from a reactive gas introduced thereto and a film on a substrate is processed with the plasma generated, wherein main members of the reaction chamber are covered with protective members made of synthetic quartz, wherein an impurity contained in the synthetic quartz is selected from the group consisting of sodium, calcium, potassium, iron and magnesium.

3. A plasma processing apparatus comprising a reaction chamber in which plasma is generated from a reactive gas introduced thereto and a film on a substrate placed on a sample stage is processed with the plasma generated, wherein a ring member made of synthetic quartz is disposed around a region of the sample stage where the substrate is placed.

4. The apparatus of claim 3, wherein an impurity is contained in the synthetic quartz at less than 0.1 ppm.

5. The apparatus of claim 3, wherein an impurity contained in the synthetic quartz is selected from the group consisting of sodium, calcium, potassium, aluminum, iron and magnesium.

6. A plasma processing method comprising the steps of:

placing a substrate, on the surface of which a silicon dioxide film has been formed, on a substrate placing region of a sample stage provided in a reaction chamber, and disposing a ring member made of synthetic quartz around the substrate placing region of the sample stage;

introducing a reactive gas into the reaction chamber and generating plasma from the reactive gas introduced; and etching the silicon dioxide film with the plasma.

* * * * *